United States Patent Office 3,813,309

Patented May 28, 1974

3,813,309

METHOD FOR STRIPPING RESISTS FROM SUBSTRATES

Peter Bakos, Wappingers Falls, and Diana J. Knight, Pine Bush, N.Y., assignors to International Business Machines Corporation, Armonk, N.Y.

No Drawing. Continuation-in-part of abandoned application Ser. No. 887,725, Dec. 23, 1969. This application Dec. 4, 1972, Ser. No. 311,577

Int. Cl. C23d *17/00;* C23g *1/02*

U.S. Cl. 156—2 8 Claims

ABSTRACT OF THE DISCLOSURE

A method for removing resist materials from substrates without leaving a deleterious residue thereon is provided. The method essentially comprises the use of a resist stripping bath composition which includes a halogenated hydrocarbon solvent, a strong organic acid, an amine and a second organic solvent.

CROSS-REFERENCE TO RELATED APPLICATIONS

This application is a continuation-in-part of copending patent application, Ser. No. 887,725, filed on Dec. 23, 1969, and now abandoned.

BACKGROUND OF THE INVENTION

Field of the invention

This invention relates to novel resist stripping methods. More particularly, it relates to a resist stripping method which comprises the use as a stripping agent, one which contains a strong organic acid, a halogenated hydrocarbon, an amine, and a second solvent.

Description of the prior art

In the preparation of printed and of other microelectronic circuitry, a resist material is deposited onto a substrate to define the desired circuitry by exposing it to actinic radiation, developing and subjecting it to either a substractive or additive operation such as etching or plating in the exposed areas of the substrate. Subsequently, the resist must be removed from the substrate either as a terminal operation or as an intermediate one, in which a subsequent coating of metal or insulative material is deposited. In the latter case it is necessary to remove the resist such that a residue does not remain. Such residue hinders subsequent operations to the point that many of them cannot be performed. For example, in printed circuitry, a photoresist is used as a mask to selectively deposit copper lands. After the lands are plated, the photoresist must be removed so that a blanket metallurgy may be deposited. If an organic residue remains on the surface after the photoresist has been removed, discontinuities in the plated metal will result.

In the past, the resist material has been removed by stripping agents such as halogenated hydrocarbons, e.g., methylene chloride and tetrachloroethylene. When using these materials alone, it is found that a residue is formed upon removal of the resist material. Removal of this residue is absolutely necessary for a subsequent coating or plating operation as above. The residue can be removed by mechanical abrasion, but this becomes an impractical method in microelectronic circuitry. Mechanical abrading methods can cause, and often do cause, the complete disruption of the desired circuitry. To overcome the disadvantages of the prior art, it is necessary to have a stripping agent capable of completely removing a resist material without leaving a residue thereon.

SUMMARY OF THE INVENTION

The present invention is directed to a method for removing photoresist material from a substrate without leaving a residue thereon, the method essentially comprising the use of a stripping agent composition, which comprises a halogenated hydrocarbon, a strong organic acid, an amine and a second solvent such as ketones, N-methyl-2-pyrrolidone, and sulfoxides. The composition used in the inventive method can be used to strip many of the conventional photoresist compositions as well as organic base paints.

It is, therefore, an object of this invention to provide a novel method for stripping photoresists from a substrate surface, the method comprising the step of using a novel photoresist stripping agent.

It is another object of this invention to provide a novel photoresist stripping method in accordance with the preceding object wherein the novel stripping agent is capable of removing a resist material from a substrate without leaving a residue thereon.

DESCRIPTION OF PREFERRED EMBODIMENTS

In the practice of the present invention, there is provided a stripping agent for removing resist materials from a substrate. The stripping agent is prepared from a first and a second solution. The first solution contains from 1 ml. to 20 ml. of an amine selected from triethanolamine, monoethanolamine and diethanolamine. The amine serves to wet the surface of the resist material to be removed. The amine is dissolved in from about 900 ml. to about 940 ml. of a halogenated hydrocarbon, e.g., methylene chloride, trichloroethane, tetrachloroethylene and the like. These halogenated hydrocarbons are strong solvents and serve to soften and to dissolve the resist material. The second solution is prepared by dissolving from about 1 gram to about 6 grams of a strong organic acid such as trichloroacetic acid, picric acid and maleic acid into about 60 ml. to about 100 ml. of a solvent selected from cyclohexanone, dimethyl sulfoxide, acetone, methylethyl ketone N-methyl-2-pyrrolidone and the like. The strong organic acid is believed to cause the removal of any residue that may normally remain on the substrate after the dissolution of the resist material. It is necessary that the amounts given for the organic acid be strictly adhered to. If one goes without the limits of the given amounts, it is found that the residue is not removed. After the above solutions are prepared, the second solution is slowly added to the first solution during mild agitation.

The substrate having a resist thereon to be removed, is dipped into the above prepared stripping agent and mildly agitated for about 25 seconds to about 180 seconds. After soaking the substrate and its resist coating for the allotted time, the resist material is found to have been removed with the absence of any residue.

Several of the generally known photoresist materials were used in the experiments of this invention and it was found that the stripping agent removed them all with equal facility and without leaving a residue. Examples of such known photoresist materials which were used in the aforementioned experiments were a light sensitized vinyl cinnamate polymer made by the Eastman Kodak Company and which is the subject matter of U.S. Pats. 2,610,-120, 2,670,285, 2,670,286, 2,690,966, 2,725,372, and 2,739,892; a light sensitized cyclized natural rubber made by the Eastman Kodak Company which is the subject matter of U.S. Pat. 2,940,853; a photopolymerizable light-sensitive benzoylazide and poly cis-1,4-isoprene made by the Eastman Kodak Company and which is the subject matter of U.S. Pat. 3,143,423; a light sensitized poly-beta-styrylacrylic acid ester of polyvinyl alcohol made by the Eastman Kodak Company; and a light sensitized polyester of isophthalic acid and 2,6-octadiene-1,8-diol made by the Dynachem Corporation. The use of photosensitive resists is described in the publications titled "An Introduction to Photofabrication Using Kodak Photosensitive Resists," 1966, Eastman Kodak Company and "Kodak Seminar on Microminiaturization," 1966, Eastman Kodak Company.

In addition, in the aforementioned experiments of this invention, there was utilized a photoresist marketed under the trade name of "Riston" which is a light sensitized methylmethacrylate polymer prepared by E. I. du Pont de Nemours & Co., Inc., and which is the subject matter of U.S. Pats. 3,245,796, 3,218,167 and 3,198,633. The nature and operating characteristics of "Riston" are described in the publication of the E. I. du Pont de Nemours & Co., Inc., entitled "Photopolymer Resist System," Photo Products Department, Riston Products Center, 2065 Rte. 22, Union, N.J. 07083.

The "Riston" photoresist is obtained as a sandwich consisting of 1 mil Mylar film and 1 mil polyethylene film with a sensitized photopolymer system layer therebetween. The Mylar acts as a barrier to oxygen and dirt and absorbs all ultraviolet radiation below 320 millimicrons. When the film resist is applied, the polyethylene is peeled off and the resist is laminated to the substrate, i.e., copper surface, with heater rollers. The sandwich is covered with a glass master of other type mask and the areas which are exposed to light become insoluble. After exposure, the Mylar is peeled off and the resist is developed in cold 1,1,1 trichloroethane spray. Analysis of the resist shows that it comprises an initiator, i.e., 2-t-butylanthraquinone, a high molecular weight polymer, i.e., polymethyl methacrylate, a low molecular weight component, i.e., pentaerythritol tetraacrylate, and a red dye, i.e., rhodamine B. The chemical nature of "Riston" is described in the IBM Process Engineering Technical Report entitled "The Chemistry of Riston Photoresist," dated May 1969, Document EN.20.0183. Its chemical nature is recapitulated as follows.

(1) PMMA polymethylmethacrylate
(2) Tetra-acrylate

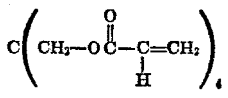

(3) Tert. butylanthraquinone

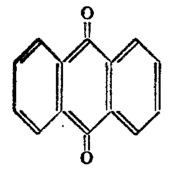

(4) Dye

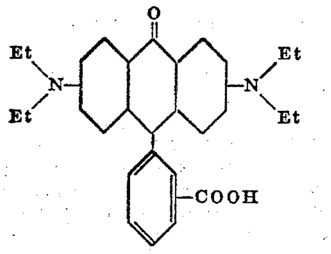

The technical properties of "Riston" photoresist are described in the IBM Technical Report, TR 22.949, entitled "Riston, Thick Film Photoresist," J. Rasile, Jan. 27, 1970.

The following examples are given by way of illustration and are not to be considered to limit the invention.

EXAMPLE I

Riston, a resist material prepared by du Pont de Nemours & Company, from polymethacryate, is applied to a substrate which may be either glass or metal and is baked at about 100° C. for 5 to 10 minutes. The resist is then exposed to actinic radiation under a predetermined pattern and developed with 1,1,1 trichloroethane. The unexposed areas of the substrate are then copper plated. After plating, the substrate is immersed in a stripping bath consisting of:

| | | |
|---|---|---|
| Methylenechloride | ml | 900 |
| Triethanolamine | ml | 1 |
| Cyclohexanone | ml | 60 |
| Trichloroacetic acid | g | 1 |

The substrate remained in the above bath for about 10 seconds after which it was removed, washed in water and air dried. It was then inspected to ascertain if a residue was present. No residue was apparent. Subsequently, the substrate is nickel plated in an electrolytic nickel bath. The resulting nickel film was found to be without defects or discontinuities.

EXAMPLE II

The procedure of Example I was performed with equally good results except that the following stripping bath was used:

| | | |
|---|---|---|
| Methylenechloride | ml | 940 |
| Triethanolamine | ml | 20 |
| Cyclohexanone | ml | 100 |
| Picric acid | g | 6 |

EXAMPLE III

The procedure of Example I was performed with equally good results except that the following stripping bath was used:

| | | |
|---|---|---|
| Methylenechloride | ml | 920 |
| Triethanolamine | ml | 10 |
| Cyclohexanone | ml | 80 |
| Maleic acid | g | 3 |

EXAMPLE IV

The procedure of Example I was performed with equally good results except that the following stripping bath was used:

| | | |
|---|---|---|
| Methylenechloride | ml | 900 |
| Triethanolamine | ml | 1 |
| Dimethylsulfoxide | ml | 60 |
| Trichloroacetic acid | g | 1 |

EXAMPLE V

The procedure of Example I was performed with equally good results except that the following stripping bath was used:

| | | |
|---|---|---|
| Methylenechloride | ml | 940 |
| Triethanolamine | ml | 20 |
| N-methyl-2-pyrrolidone | ml | 100 |
| Trichloroacetic acid | g | 6 |

EXAMPLE VI

The procedure of Example I was performed with equally good results except that the following stripping bath was used:

| | | |
|---|---|---|
| Methylenechloride | ml | 900 |
| Triethanolamine | ml | 1 |
| Methylethylketone | ml | 60 |
| Trichloroacetic acid | g | 6 |

EXAMPLE VII

The procedure of Example I was performed with equally good results except that the following stripping bath was used:

| | | |
|---|---|---|
| Methylenechloride | ml | 940 |
| Triethanolamine | ml | 20 |
| Methylisobutylketone | ml | 100 |
| Trichloroacetic acid | g | 6 |

EXAMPLES VIII AND IX

For the sake of comparison, the procedure of Example I was performed with the exception that the prior art stripping bath, methylene chloride and a 50–50 methylene chloride-methanol were respectively used. It was found that after stripping, a white residue remained in both cases. Further, the plated nickel film was found to have discontinuities therein.

What is claimed is:

1. In a method wherein exposed photoresist is stripped from a substrate by immersion in a stripping bath, the improvement which comprises the step of Utilizing as said resist stripping bath one which comprises:

(a) a halogenated hydrocarbon solvent selected from the group consisting of methylene chloride, trichloroethane, and tetrachloroethylene, said solvent being present in the amount of about 900 ml. to about 940 ml.;

(b) a strong organic acid selected from the group consisting of trichloroacetic acid, picric acid, and maleic acid, said strong organic acid being present in the amount of about 1 gram to about 6 grams;

(c) an amine selected from the group consisting of monoethanolamine, diethanolamine, and triethanolamine, said amine being present in the amount of about 1 ml. to about 20 ml.; and (d) a second solvent selected from the group consisting of cyclohexanone, acetone, methylisobutyl ketone, methylethyl ketone, dimethyl sulfoxide and N-methyl-2-pyrrolidone, said second solvent being present in the amount of from about 60 ml. to about 100 ml.

2. In a method as defined in claim 1 wherein:

said halogenated hydrocarbon solvent is methylene chloride in a quantity of about 900 ml.;

said strong organic acid is trichloroacetic acid in a quantity of about 1 gram;

said amine is triethanolamine in a quantity of about 1 ml; and said second solvent is cyclohexanone in a quantity of about 60 ml.

3. In a method as defined in claim 1 wherein:

said halogenated hydrocarbon solvent is methylene chloride in a quantity of about 940 ml.;

said strong organic acid is picric acid in a quantity of about 6 grams;

said amine is triethanolamine in a quantity of about 20 ml.; and said second solvent is cyclohexanone in a quantity of about 100 ml.

4. In a method as defined in claim 1 wherein:

said halogenated hydrocarbon solvent is methylene chloride in a quantity of about 920 ml.;

said strong organic acid is maleic acid in a quantity of about 3 grams;

said amine is triethanolamine in a quantity of about 10 ml.; and said second solvent is cyclohexanone in a quantity of about 80 ml.

5. In a method as defined in claim 1 wherein:

said halogenated hydrocarbon solvent is methylene chloride in a quantity of about 900 ml.;

said strong organic acid is trichloroacetic acid in a quantity of about 1 gram;

said amine is triethanolamine in a quantity of about 1 ml.; and said second solvent is dimethylsulfoxide in a quantity of about 60 ml.

6. In a method as defined in claim 1 wherein:

said halogenated hydrocarbon solvent is methylene chloride in a quantity of about 940 ml.;

said strong organic acid is trichloroacetic acid in a quantity of about 6 grams;

said amine is triethanolamine in a quantity of about 20 ml.; and said second solvent is N-methyl-2-pyrrolidone in a quantity of about 100 ml.

7. In a method as defined in claim 1 wherein:

said halogenated hydrocarbon solvent is methylene chloride in a quantity of about 900 ml.;

said strong organic acid is trichloroacetic acid in a quantity of about 6 grams;

said amine is triethanolamine in a quantity of about 1 ml.; and said second solvent is methylethylketone in a quantity of about 60 ml.

8. In a method as defined in claim 1 wherein:

said halogenated hydrocarbon solvent is methylene chloride in a quantity of about 940 ml.;

said strong organic acid is trichloroacetic acid in a quantity of about 6 grams;

said amine is triethanolamine in a quantity of about 20 ml.; and said second solvent is methylisobutylketone in a quantity of about 100 ml.

References Cited

UNITED STATES PATENTS

| | | | |
|---|---|---|---|
| 3,235,426 | 2/1966 | Bruner | 156—2 |
| 3,582,401 | 6/1971 | Berilla et al. | 134—3 |

WILLIAM A. POWELL, Primary Examiner

U.S. Cl. X.R.

134—3, 38; 156—8; 252—79.1